United States Patent [19]

Ogiue et al.

[11] 4,219,369
[45] Aug. 26, 1980

[54] METHOD OF MAKING SEMICONDUCTOR INTEGRATED CIRCUIT DEVICE

[75] Inventors: Katsumi Ogiue, Hinode; Takahisa Nitta, Fuchu; Kazumichi Mitsusada, Kodaira; Masato Iwabuchi, Tokyo; Masanori Odaka, Fuchu, all of Japan

[73] Assignee: Hitachi, Ltd., Tokyo, Japan

[21] Appl. No.: 931,007

[22] Filed: Aug. 4, 1978

[30] Foreign Application Priority Data

Sep. 30, 1977 [JP] Japan ................. 52-116847
Sep. 30, 1977 [JP] Japan ................. 52-116848
Sep. 30, 1977 [JP] Japan ................. 52-116849
Oct. 14, 1977 [JP] Japan ................. 52-122358
Oct. 14, 1977 [JP] Japan ................. 52-122359

[51] Int. Cl.² ........................................ H01L 21/26
[52] U.S. Cl. ................................ 148/1.5; 148/175; 148/187; 29/571
[58] Field of Search ............... 148/1.5, 175, 187; 29/571

[56] References Cited

U.S. PATENT DOCUMENTS

| | | | |
|---|---|---|---|
| 3,342,640 | 9/1967 | Seki et al. | 148/187 |
| 3,560,278 | 2/1971 | Sanera | 148/187 |
| 3,659,160 | 4/1972 | Sloan et al. | 148/175 X |
| 3,755,001 | 8/1973 | Kooi et al. | 148/1.5 |
| 3,901,737 | 8/1975 | Dash | 148/1.5 |
| 3,928,081 | 12/1975 | Marley et al. | 148/1.5 |
| 3,933,540 | 1/1976 | Kondo et al. | 148/187 |
| 3,997,378 | 12/1976 | Kaji et al. | 148/174 |
| 4,008,107 | 2/1977 | Hayasaka et al. | 148/187 |
| 4,014,714 | 3/1977 | Murrmann et al. | 148/1.5 |
| 4,042,726 | 8/1977 | Kaji et al. | 427/93 |
| 4,047,195 | 9/1977 | Allison | 357/55 |
| 4,088,516 | 5/1978 | Kondo et al. | 148/175 |
| 4,111,724 | 9/1978 | Ogine et al. | 148/175 |

Primary Examiner—G. Ozaki
Attorney, Agent, or Firm—Craig & Antonelli

[57] ABSTRACT

The invention relates to a method of making a semiconductor integrated circuit device, and aims at diminishing the size of the isolating region which isolates the adjacent semiconductor elements from each other. The method of the invention has the steps of forming on a substrate a deposition layer of diffused impurities of different conductivity type from that of the substrate, forming a masking film having apertures on the deposition layer, effecting an etching through making use of the masking film as the diffusion mask, so as to etch the portions of the deposition layer and the substrate under the apertures, thereby to form grooves which divide the deposition layer into island-like deposition layer sections, and stretching and diffusing the impurities in each island-like deposition layer section to form a diffusion layer which constitutes a part of a semiconductor element.

12 Claims, 29 Drawing Figures

METHOD OF MAKING SEMICONDUCTOR INTEGRATED CIRCUIT DEVICE

BACKGROUND OF THE INVENTION

The present invention relates to a method of making semiconductor integrated circuit device and, more particularly, to a method of making a bipolar LSI (Large Scale Integrated Circuit).

As a measure for electrically isolating the semiconductor elements (transistors) of a semiconductor integrated circuit device (referred to as IC device, hereinafter), an isolation method making use of semiconductive oxides is becoming popular. This method is superior to the conventional PN junction and isolation method in that the occupied area is made small, so as to contribute to further improve the scale of integration of the IC device.

The current demand of increment of number of circuit facilities in one IC device requires a further increased scale of integration of transistors.

The isolation by means of the oxide film is effective in diminishing the occupied area as compared with the PN junction, as stated above, but inconveniently requires an uneconomically large isolation region, which well reaches about 70% of the chip area, due to the lateral spreading of the isolating semiconductor oxide layer. This goes quite contrary to the demand for the increment of the scale of integration.

More specifically, the isolation by means of the oxide film is effected by heating and oxidizing a part of the semiconductive substrate. During this heating, the oxide unfavourably forms bird-heads 27 and bird-beaks 26 as shown in FIG. 1, due to the thermal expansion of the same, so as to hinder the increment of the integration scale. In this FIG. 1, 1 is a P type silicon wafer, 2 is a N+ type buried layer and 8 is an N type layer.

In forming LSI, especially the bipolar LSI, an N+ type buried layer is usually formed in each transistor, in order to minimize the serial resistance of collectors. This N+ type buried layer formed on the P type silicon substrate inconveniently spreads laterally, so that it is necessary to space adjacent N+ type buried layers away from each other by a sufficiently large distance, in order to obtain the characteristics necessary for the isolation. In addition, it is necessary to preserve a masking margin between the N+ type buried layer and the isolating oxide layer. For these reasons, the improvement of the integration scale has been hindered also by the N+ type buried layer.

Further, in forming transistors in a semiconductive substrate surrounded by the semiconductor oxide layers, photo etching process is indispensable for forming the emitter regions, base regions and high concentration diffusion region for leading out the collector electrodes, and for perforation in the oxide for forming the wiring contact for these regions.

In carrying out this photo etching process, it is a common measure to preserve a sufficiently large masking margin, making use of the fact that the oxide layer of the isolation region has a thickness greater than that of the oxide layer on the portion of the semiconductive substrate where the transistor is formed. Consequently, the oxide on the isolation region is partially etched to cause a more drastic difference of the height between the oxides.

More specifically, according to the prior art technic, the transistor has been formed through perforating the oxide film 28 on the substrate, in contact with the isolating semiconductor oxide 25, as will be seen FIG. 2. However, since the etching rates or speeds of the oxide film 28 on the substrate and the isolating semiconductor oxide 25 are equal, both of them are etched in the course of the photo etching for the perforation. Consequently, the junction areas, where the semiconductor oxide film is contacted by the emitter 21, base 7 and collector 16, are inconveniently grooved as at 29, resulting in various inconvenience such as shortcircuitting across the junction, breakage of the wiring and pin holes or cracks in the intermediate insulation layer in the multi-layered wiring construction.

Various proposals and attempts have been made to overcome these problems. One of these attempts is to form a diffusion layer 30 of high concentration at the side wall portion of the semiconductor oxide film, so as to make the depth of the base layer at above mentioned junction area larger. Another method is to carry out the high-concentration diffusion for forming the base, so that the oxide film may not be formed to have a large thickness at the time of the diffusion, and to take a step of washing out before the Al evaporation.

These countermeasures are, however, disadvantageous in that they cause an increase of parasitic capacitance of the junction and larger depth of the base, resulting in a narrower current-gain range of the transistor, which makes it extremely difficult to obtain a high speed semiconductor integrated circuit device.

The specifications of U.S. Pat. Nos. 3,659,160; 3,775,001; 3,997,378 and 4,042,726 disclose a method for making a semiconductor integrated circuit device having steps of forming an active region of a desired depth in the semiconductive substrate, by means of diffusion, forming a plurality of grooves in the semiconductive substrate by a selective etching, in order to divide the active diffusion region into a plurality of sections, and then forming oxide films in the grooves. According to this method, an impractically long etching time is required, since the semiconductive substrate has to be etched deep enough to divide the active diffusion region. In addition, this etching process inconveniently causes an etching of the substrate in the lateral direction, i.e. the side etching, resulting in a larger width of each groove. Consequently, the area occupied by the isolation region is rendered undesirably large.

SUMMARY OF THE INVENTION

It is therefore a major object of the invention to provide a novel method of making a semiconductor integrated circuit device, which affords a production of a device having a high scale of integration thanks to a diminished area occupied by the isolation regions.

It is another object of the invention to provide a novel method of making a semiconductor integrated circuit device in which the diffusion layers and the contact apertures of respective elements constituting the IC are formed by self-alignment.

To these ends, according to the invention, there is provided a method of making a semiconductor integrated circuit device comprising the steps of: forming on the whole surface area of a semiconductive substrate a diffused impurity deposition layer of a conductivity type different from that of the substrate; forming deposition layer islands through dividing the deposition layer by grooves which are formed by effecting an etching on the parts of the deposition layer and the parts of the substrate beneath the deposition layer parts, making use of an etching mask having apertures and placed on the deposition layer; and forming diffusion layers of a desired depth constituting a part of the semiconductor element, through allowing a stretch-diffusion of the impurities in the deposition layer.

DESCRIPTION OF THE PREFERRED EMBODIMENTS

Embodiment 1

Figure 1:
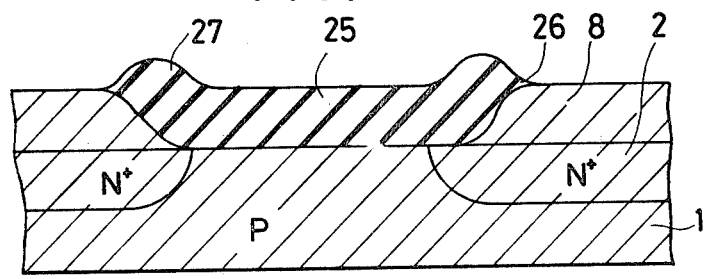
FIGS. 1 and 2 are cross-sectional views of a conventional semiconductor integrated circuit device illustrating the problems inherent in the latter.
Figure 2:
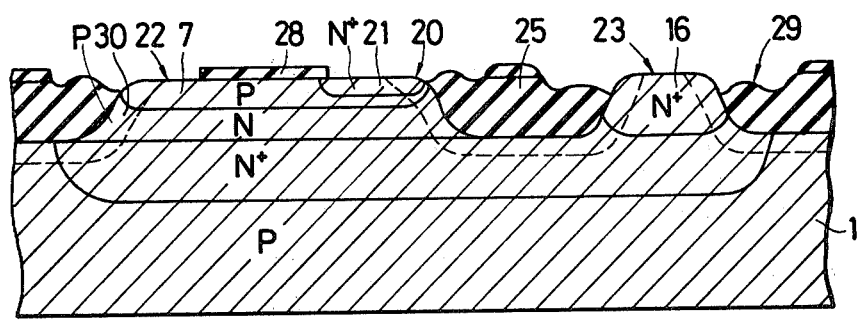
Figure 3:
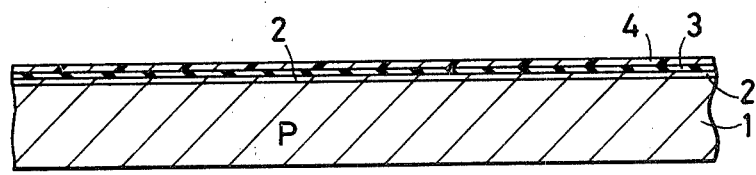
FIGS. 3 to 8 show in sections steps of process, which is an embodiment of the invention, of making a bipolar type IC device.
Figure 4:
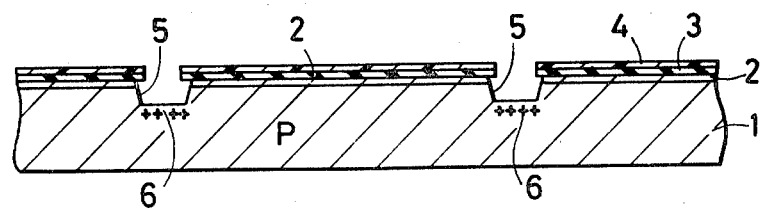
Figure 5:
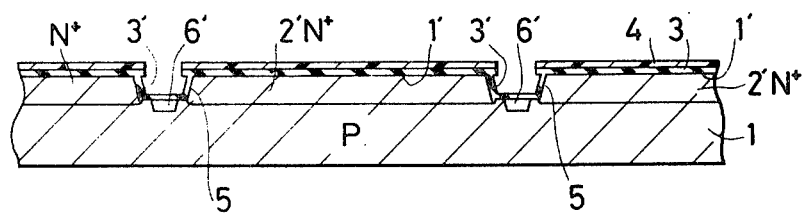
Figure 6:
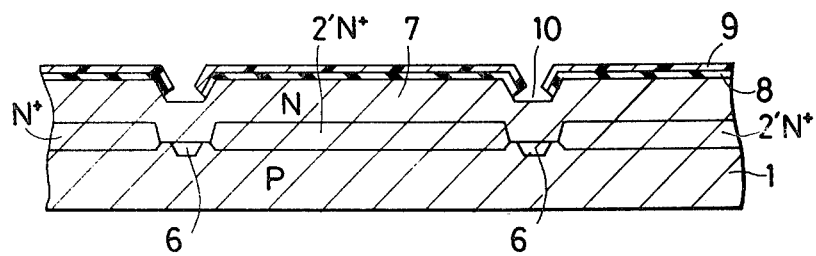
Figure 7:
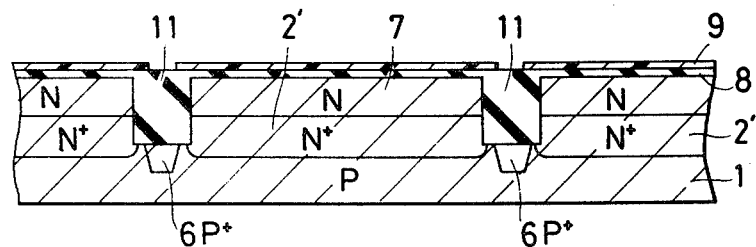
Figure 8:
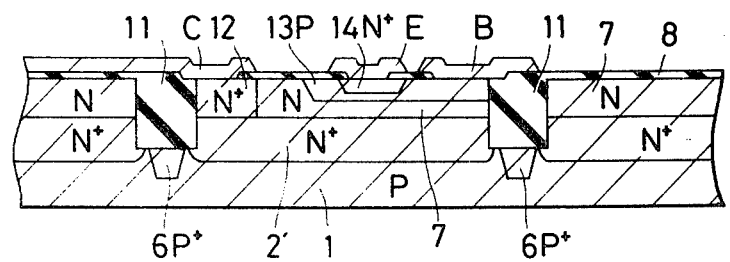
Figure 9:
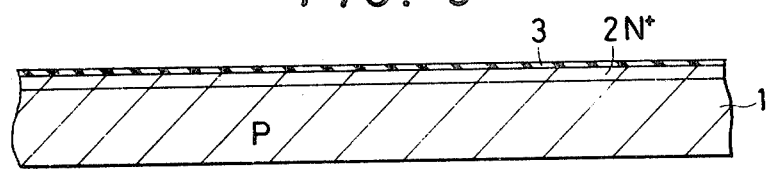
FIGS. 9 to 19 show in section steps of a process, which is another embodiment of the invention, for making a bipolar type IC.
Figure 10:
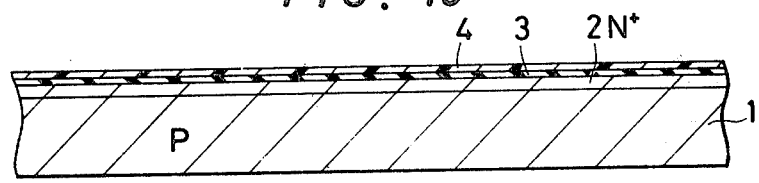
Figure 11:
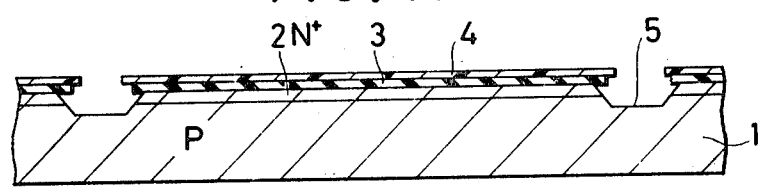
Figure 12:
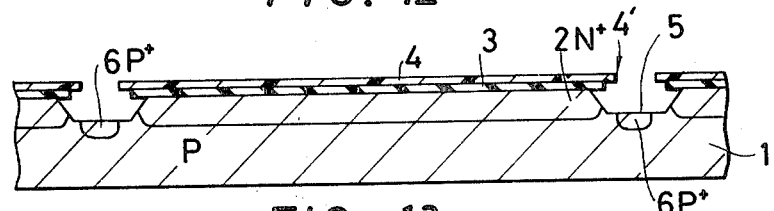
Figure 13:
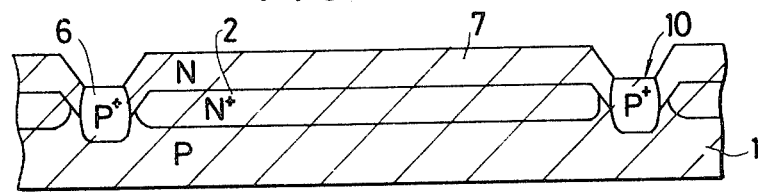
Figure 14:
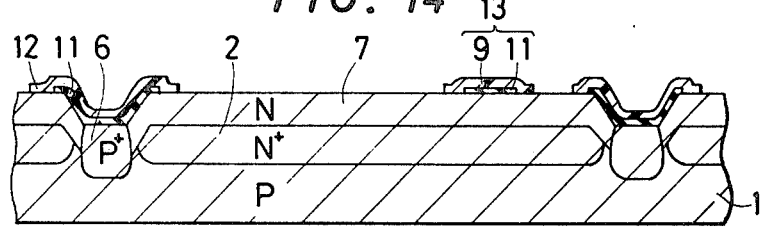
Figure 15:
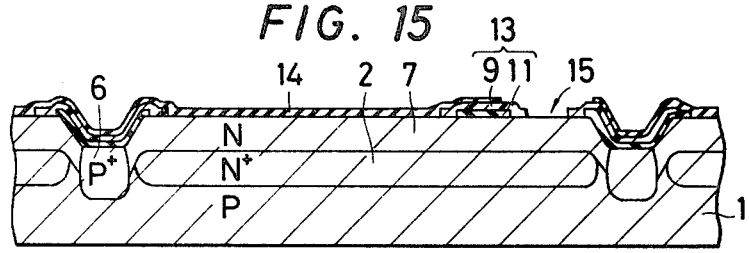
Figure 16:
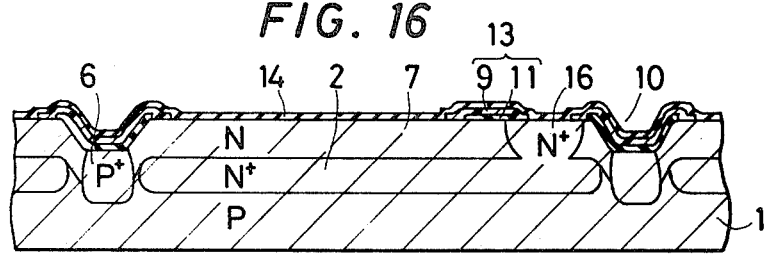
Figure 17:
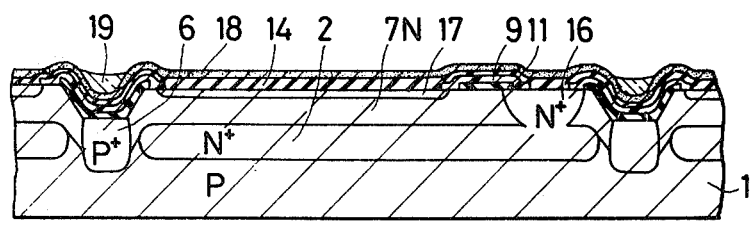
Figure 18:
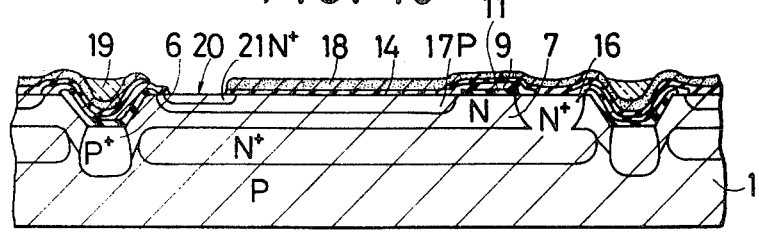
Figure 19:
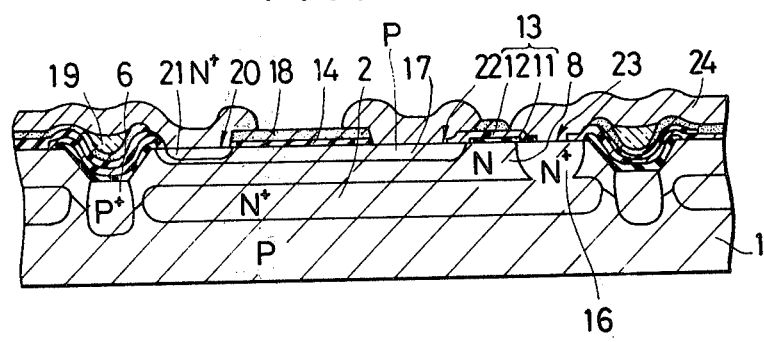

Hereinafter, an IC making process embodying the present invention will be described with specific reference to FIGS. 3 to 8.

(1) At first a P type silicon wafer 1 having a specific resistance of 10 to 20 $\Omega$cm is prepared. Then, an N+ type deposition layer having a specific surface resistance of about 30$\Omega$/□ for the buried layer is formed over the entire surface of the wafer 1. The depth of this deposition layer is 0.3 to 0.8 $\mu$m, preferably 0.4 $\mu$m. Then, etching mask films 3,4 are formed. The etching mask film 3 is a silicon oxide film of about 1000 Å thick formed by heat-oxidizing the surface, while the etching mask film 4 is a silicon nitride (Si$_3$N$_4$) film of about 1500 Å thick formed by CVD method. More specifically, this silicon nitride film 4 is formed by a heat treatment which is performed for 6 minutes at about 850° C., within an atmosphere containing monosilane (SiH$_4$) and ammonia (NH$_4$). (See FIG. 3)

(2) Then, photo etching is effected on the silicon nitride film 4 and the silicon oxide film 3. More specifically, the silicon nitride film 4 is selectively perforated by a plasma ethcing making use of freon gas, and the silicon oxide film is perforated making use of the silicon nitride film 4 as a mask, by means of an admixture of ammonium fluoride and fluoric acid, so as to expose the portions of the wafer 1 which are to form the oxide film isolation regions. Then, an etching is effected on the wafer 1, making use of the residual silicon nitride film 4 as the mask, with an admixture liquid of nitric acid and fluoric acid, so as to form grooves 5 of 0.6 to 1.0 $\mu$m depth. Thus, these grooves are formed sufficiently deeper than the N+ type deposition layer 2.

P type impurities 6 such as boron are ion-implantated only to the bottoms of these grooves 5, with an implantation energy of about 50 KeV, so as to form ion-implantation layer for providing channel stoppers. The implantation of P type impurities 6 can be efficiently concentrated to the bottoms of the grooves, thanks to the overhanging construction of the etching masks 3,4 over the grooves. (See FIG. 4)

(3) Then, a stretching diffusion of the N+ type deposition layer 2 is carried out by a heat treatment at a temperature of 1100° C., so that an N+ type buried layer 2' of about 2$\mu$m is formed. A reference numeral 3' denotes a silicon oxide film formed in the course of the stretching diffusion.

It is to be noted here that, since the stretching diffusion of the N+ type deposition layer 2 is effected after the formation of the grooves, the PN junction between the N+ type buried layer 2' and the semiconductive substrate 1 is directed, in the vicinity of each groove 5, toward the extension of the major surface 1' of the semiconductor substrate. This situation will be more fully understood from a description which will be given later with reference to FIG. 21. A reference numeral 6' denotes a P+ type channel stopper formed as a result of the thermal diffusion of the P type impurity ions (See FIG 5).

(4) The silicon oxide films 3,3' and the silicon nitride film 4, which are now useless, are removed. Then, an N type layer (or a P type layer) 7 of 1.0 to 1.5 $\mu$m thick and having a specific resistance of 1 $\Omega$cm is formed through an epitaxial growth, over the entire surface. Thus, the N type layer 7 is recessed as its portions overlying the grooves formed in the silicon wafer 1.

Subsequently, masking films 8,9 for the selective oxidation are formed over the entire surface. The masking film 8 is a silicon oxide film, while he film 9 is a silicon nitride film. These masking films 8,9 are formed in the same condition as that for the formation of the silicon oxide film 3 and the silicon nitride film 4 as stated in the foregoing step 1. Then, only the bottom surfaces of the grooves 10 in the N type layer 7 are selectively removed to form windows. (See FIG. 6) In this FIG. 6, 6 denotes a P+ type channel stopper.

The formation of these windows is made such that, for a later-mentioned reason, the masking films for the selective oxidation remain at the shoulder portions of the grooves 10 in the N type layer 7, so as to cover these shoulder portions. (See FIG. 6)

(5) Then, silicon oxide films 11 for the isolation are formed through an oxidation heat treatment for 60 minutes and at about 1000° C., within an oxidizing atmosphere, making use of the selective-oxidation masking films 8;9 to help prevent bird-beak formation.

In this heat treatment, only a small lateral spreading of the isolating silicon oxide film 11 is allowed, and no bird-beak formation takes place partly because the regions of the N type layer 7 where the films 11 are to be formed are recessed and partly because the shoulder portions of these recesses are covered with the selective oxidation masking films 8,9 so as to ensure a smooth surface of each isolating silicon oxide film 11. Since the lateral heat o oxidation is minimized, the area occupied by the isolating silicon oxide films is considerably reduced. (See FIG. 7).

(7) Then, after removing the silicon nitride film 9 which is now unnecessary, an N+ type silicon contact 12 and, then, a P type base 13 are formed in the N type layer 7, making use of the silicon oxide film as the diffusion mask. Then, an N+ type emitter layer 14 is formed in the P type base layer 13. Subsequently, after forming respective contact windows through the silicon oxide film 8, respective electrodes, i.e. a base electrode B, a collector electrode C and an emitter electrode E and so forth are formed, through a vacuum evaporation of aluminum of 1 μm thick and a photo etching. (See FIG. 8)

EMBODIMENT 2

Hereinafter, another process, which is a second embodiment of the invention, for making a bipolar type IC device will be described with reference to FIGS. 9 thru 19.

(1) At first a P type silicon substrate 1 having a specific resistance of 10 to 20 Ωcm is prepared as a starting material. Then, antimony is deposited over the entire surface of the substrate 1, so as to form an N+ type region 2 of 0.3 μm depth and having a specific surface resistance of about 30 Ω/□, as well as an oxide film 3 of about 1000 Å thick.

(2) Then, a silicon nitride (Si₃N₄) film 4 of about 1500 Å thick is formed on the oxide film 3, through a heat treatment for 6 minutes at 850° C. in an atmosphere containing monosilane (SiH₄) and ammonia (NH₄). (See FIG. 10) (3) Then, a photo etching is effected on these silicon nitride film 4 and the oxide film 3. More specifically, the silicon nitride film 4 is selectively perforated by a plasma etching by means of freon gas, and then the oxide film 3 is perforated making use of the silicon nitride film 4 as a mask by an admixture liquid of fluoric acid and ammonium fluoride, so as to expose the surface of the silicon. Then, the silicon substrate 1 is etched by an admixture liquid of nitric acid and fluoric acid, making use of the residual silicon nitride film as the mask, so as to form grooves 5 having a depth of 0.6 to 1.0 μm, preferably 0.6 μm, thereby to divide the N+ type region into a plurality of island-like sections. (See FIG. 11)

(4) Then, boron ions are implantated over a mask of the silicon nitride film 4, at an energy level of about 50 KeV, so as to form P+ type regions 6. The P+ type regions are concentrated specifically to the bottoms of the grooves 5, thanks to the overhanging portions 4' of the silicon nitride film which have been formed in the course of the formation of the grooves 5. Then, a heat treatment at 1100° C. is effected to make the N+ type region and the P+ type regions 6 have desired profile of concentration. (See FIG. 12)

(5) Then, the silicon nitride film 4 and the oxide film 3 are removed by the aforementioned plasma etching and admixture liquid of fluoric acid and ammonium fluoride, so as to expose the surface of the silicon substrate. Then, a silicon (Si) layer including N type impurities is allowed to grow on the surface of the silicon substrate, by a gaseous phase reaction which is well known per se, so as to form an N type epitaxial layer 7 having a specific resistance of 1 Ωcm and a thickness of 1.0 to 1.5 μm. During this growth, grooves 10 are formed also in the epitaxial layer 7, because of the presence of the grooves 5 in the silicon substrate surface. As a result of this gaseous phase reaction, the N+ type region 2 and the P+ type regions 6 are diffused through the epitaxial layer 7. More specifically, the N+ type region 2 is diffused into the epitaxial layer 7 by about 0.2 μm from the surface of the silicon substrate, while the P+ type regions are diffused so as to contact the surface of the epitaxial layer in each groove 10 of the epitaxial layer. (See FIG. 13)

(6) Then, a heat treatment at 1000° C. is effected on the surface of the epitaxial layer 7 for 180 minutes within an oxidizing atmosphere, so as to form an oxide (SiO₂) film 11 of about 1000 Å thickness, and this oxide film is selectively perforated by a photo etching. Then, in the same condition as the foregoing step 2, the silicon nitride (Si₃N₄) film 9 is made to grow, and is selectively perforated by a photoetching so as to cover the aforementioned oxide film 11.

It is to be noted that the double-layer structure 13 of the oxide film 11 and the silicon nitride film 9 is formed to remain on the groove regions 10 of the epitaxial layer 7 and on the boundary between the later-mentioned high-concentration N+ type collector electrode lead out electrode and the base region.

The oxide film 11 is provided for preventing the silicon from being degraded by a high stress caused in the silicon surface by the silicon nitride, at the boundary therebetween. Thus, this oxide film 11 can be dispensed with, when such a material as would not impart a large stress to the silicon surface, e.g. oxinitride silicon film, is used. 12 denotes a silicon nitride (Si₃N₄) film. (See FIG. 14)

(7) Then, the surface of the epitaxial layer uncovered by the double-layer region 13 is subjected to a heat treatment at 1000° C. for about 180 minutes in an oxidizing atmosphere, so as to form an oxide (SiO₂) film 14 of about 1500 Å thick. Then in order to produce a high-concentration N+ type region for leading out the collector electrode, the oxide film 14 is selectively removed by a photoetching to form an aperture 15. This aperture 15 is located within the area of the aforementioned double-layer region 13. This photo etching is made with an admixture liquid of fluoric acid and ammonium fluoride. Thanks to the large difference of etching speeds between the oxide film 14 and the silicon nitride film 9, the size of the aperture is determined by the silicon nitride film 9, so that the aperture can be formed with a sufficiently large masking tolerance. (See FIG. 15)

(8) A heat-treatment is effected within an atmosphere of 1000° C. and containing phosphorus, so that the phosphorus may be diffused through the epitaxial region 7 via the aperture 15 to reach the N+ type region 2, thereby to form an N+ type region 16 of high concentration for leading out the collector electrode. This diffusion is effected at first by heating the material in the phosphorus-containing atmosphere of 1000° C. for 30 minutes, so as to deposit the phosphorus impurities in the form of oxides on the surface of the substrate, and then heating the same at 1000° C. for 20 minutes in an oxidizing atmosphere, so as to effect a stretching diffusion making use of the phosphorus as the diffusion source, thereby to form the N+ type region 16. (See FIG. 16)

(9) Then, boron ions are dosed into the epitaxial layer 7 through the oxide film 14, by an ion implantation with an energy of about 50 KeV, thereby to form a P type base region 17. During this ion implantation, no boron ion is implanted to the epitaxial layer 7 under the double-layer region 13, because the latter is covered with the silicon nitride film 9. At the same time, no P type region is formed in the high-concentration N+ type region for taking out the collector electrode, because the boron is fairly compensated by the phosphorus.

The base layer can be formed by self-alignment, without necessitating the mask.

The intensity of boron ion implanted to the epitaxial layer through the oxide film 14 is about $2 \times 10^{14}$ atoms/cm$^2$, so as to form, as a result of a later-mentioned heat treatment for diffusion of an emitter, a layer of 0.5 μm depth and a specific surface resistance of 500 Ω/□. Further, in order to eliminate the defects caused by the ion implantation, a heat treatment is effected in an N$_2$ atmosphere at 1000° C. for about 10 minutes.

Subsequently, the material is heat-treated at about 410° C. for 7 minutes, within an atmosphere containing monosilane (SiH$_4$) and phosphorus hydride (PH$_3$), so as to form a PSG (Phospho-Silicate-Glass) film 18 of about 2500 Å thick thereon. Then, a viscous SOG (Spin-On-Glass) film 19 is formed by a rotary applying method at 7000 r.p.m. This SOG film 19 has a fluidity large enough to flatten the grooved portions 10 of the substrate by the rotary application.

Then, a heat treatment is carried out at a condition of 1000° C. and 10 minutes, in an atmosphere of hydrogen chloride, so as to make the structures of the SOG film and the PSG film more fine.

The SOG film can be substituted by an organic insulating material having a certain viscosity. In such a case, the organic material is applied to the surface of the substrate and then solidified by a heat treatment. A small amount of impurities such as Na ions included by the material does not matter, because the silicon surface is fairly protected by the silicon nitride film 9. (See FIG. 17)

(10) Then, a photo etching is effected with an etching liquid of mixture of fluoric acid and ammonium fluoride, so as to selectively etch and perforate the SOG film 19, PSG film 18 and the oxide film 14, so as to form the emitter layer. In this connection, it is to be pointed out that, even when the emitter is formed to contact at its portion the silicon nitride film, the contacting area is determined by the silicon nitride film, so that the distance between the emitter and the base generated in the course of the semiconductor isolation is made extremely small at this area, thereby to eliminate the danger of shortcircuitting between the emitter and the collector. After the photo etching, arsenic is diffused through this aperture 20, so as to form an N+ type region 21 of about 0.3 μm thick and having a specific surface resistance of 17Ω/□. This diffusion is made by placing the substrate along with metallic arsenic within an ampul evacuated to about 0.3 Torr, and heating the same at 1000° C. for 2 hours. Almost no oxide film is formed on the N type emitter. (See FIG. 18)

Then, in order to make wiring connection in the IC through achieving contacts of the base and collector regions with the IC wiring, a photo etching is effected to selectively etch the SOG film 19, the PSG film 18 and the oxide film 14 on the surface of the P type base and the surface of the high-concentration N+ type region for leading out the collector electrodes, so as to form apertures 22,23.

This etching is effected by an etching liquid of admixture of fluoric acid and ammonium fluoride.

Then, prior to an evaporation of aluminum 24, which is an electrode material for the wiring, on the surface of the substrate 1, the surface of the substrate 1 is etched for 10 seconds by the admixture of fluoric acid and ammonium fluoride, so as to completely remove the oxide films on the aperture 20,22,23 of the contact regions of the emitter, base and collector.

Then, the substrate is placed on a plate which is maintained at 300° C., and the aluminum 24 is evaporation-deposited by electron-beam evaporation to have a thickness of about 1 μm. Finally, the required wiring connection is completed by a suitable photo etching treatment.

Figure 20:
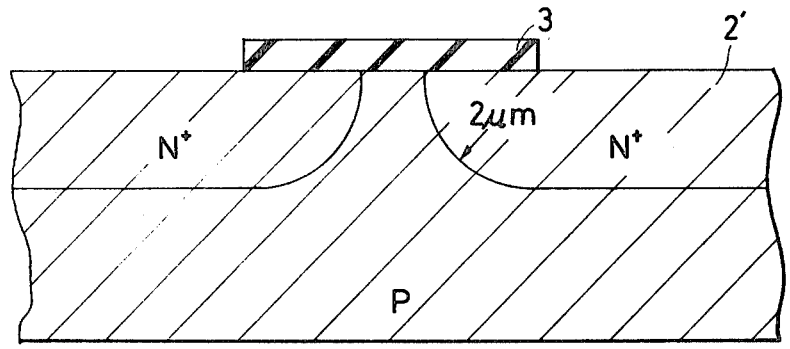
FIG. 20 is a sectional view of an IC device for explaining the drawback of a conventional IC making process.

Following advantages are offered by the present invention. (A) Conventionally, the N+ type buried layer 2 is formed by a selective diffusion as shown in FIG. 20. This selective diffusion allows the diffusion of the impurities also in the lateral direction. In case that the N+ type buried layer is formed to have a depth of 2 μm, the layer is spread laterally from the edge of the etching mask 3 consisting of silicon oxide by 2 μm.

In sharp contrast to the above, according to the invention, before the stretching diffusion of the formed N+ deposition layer 2, grooves 5 are formed to prevent the lateral spreading of the latter.

Namely, as has been stated in the description of the embodiment, at first the N+ type deposition layer 2 is formed to have a depth of 0.3 μm. Then, grooves 5 of 0.6 μm depth are formed to divide the layer 2 into a plurality of island-like sections, in the semiconductive substrate 1.

Figure 21:
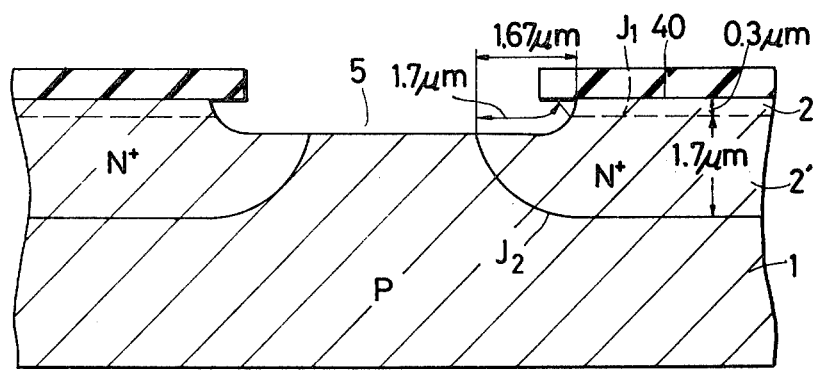
FIG. 21 is a sectional view of an IC device for explaining the advantage of the IC making process in accordance with the invention.

Then, as a stretching diffusion of the impurities to the depth of 2 μm from the surface of the semiconductive substrate 1, the lateral diffusion of the impurities is made, as will be seen from FIG. 21, along the grooves 5. That is, the distance between the end of the PN junction J$_1$ formed between the N+ type deposition layer 2 and the semiconductive substrate 1, and the end of the PN junction J$_2$ formed between the N+ type buried layer 2' and the semiconductive substrate 1 is 1.7 μm.

Consequently, the length of the lateral stretching diffusion in the extension of the surface 40 of the semiconductive substrate is materially 1.67 μm. This length is shorter by about 0.3 μm than that obtained by the conventional selective diffusion for each end of the N+ type diffusion layer 2', and by 0.6 μm for both ends of the same. This decrease of the size is of a great significance in the high speed bipolar IC memory device in which about 5000 to 6000 N+ type buried layers are formed in one chip. The current demand of increment of the integration scale requires a correspondingly increased number of N+ buried layers. From this point of view, the suppression of the lateral spreading of the N+ buried layer is quite advantageous and remarkable.

According to the invention, the circumferential length of the groove 5 is made larger by increasing the depth of the same, so that the adjacent N+ layers can be fairly isolated from each other without enlarging the diameter of the etching perforation in the mask.

In addition, the method of the invention brings about the following advantages over the prior-art method in which the diffusion layer is formed over the entire surface of the semiconductor substrate, and then dividing the latter into sections.

Figure 22:
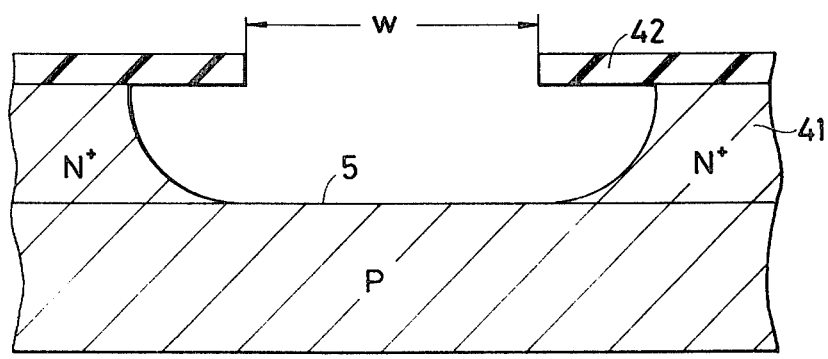
FIG. 22 is a sectional view of an IC device for explaining a drawback of another conventional IC making process.

This prior-art technic requires a very long etching time for dividing the diffusion layer 41 of 2 μm thick. At the same time, a side etch is caused over 2 μm from the marginal edge of the etching mask 42, as shown in FIG. 22, so as to make the width of the groove extremely large. Consequently, the areas of the surface of the semiconductive substrate, on which the semiconductor elements are to be formed, are inconveniently diminished. It may seem that the width of the groove can be made small by making the diameter w of the aperture in the etching mask smaller. However, since a side etch of 4 μm (2 μm at each side edge) is unavoidable, the width of the formed groove cannot be made smaller than w+4 μm. Thus, if the diameter of the aperture in the etching mask is made as small as possible, it is impossible to divide the diffusion layer of 2 μm thick, because of insufficient permeation and circulation of the etching liquid through such a small aperture. At the same time, when the epitaxial layer is formed on the entire surface of the semiconductive substrate having such deep grooves, steps or discontinuities of the epitaxial layer are likely to be formed. In addition, the subsequent mask setting is hindered by the too large height differential at these steps.

To the contrary, according to the method of the invention, the above stated problems of the prior-art technic can fairly be overcome, because the depth of the grooves can be made sufficiently small. (B) According to the method of the invention, particularly the method of embodiment 1, the silicon oxide film 9 for the isolation purpose is formed by heat oxidation of the recessed N type layer 7. In this oxidation, the masking films 8,9 for selective oxidation are used for covering the shoulder portions of the recesses. It is therefore possible to form the N+ type buried layer 2' and the isolating silicon oxide film 11 by self-alignment. At the same time, the lateral stretching of the isolating silicon oxide film 11 can be greatly diminished. (C) For the reasons as stated in the above items (A) and (B), it is derived that, according to the invention, the N+ type buried layer 2' and the isolating silicon oxide film 11 can be made to have smaller area. In addition, the undesirable bird head is avoided to insure a smoother surface of the isolation region, so that it becomes possible to make the most of the regions for the formation of the elements, and to form the elements and wirings by a fine or minute processing, so as to insure an enlarged scale of integration and improved performance of the device. Especially, the scale of integration is two times as large as that of the device produced by the conventional methods. (D) The channel stopper can be formed by self-alignment, through making a direct use of the etching mask film having an overhanging construction, which has been used for the grooving. (E) Because of the elimination of the undesirable bird-beak phenomenon, it is possible to incorporate various types of elements such as transistors of washed-emitter structure in the LSI. This affords a large degree of freedom in design of an LSI and wider use of the same. (F) According to the method of the invention as explained as the second embodiment, an anti-oxidation film such as silicon nitride, which is used as the formation of the oxide film isolation, is provided on the isolation region (P+ type region 6), in sharp contrast to the conventional method in which the oxide film isolation is made by selectively heat oxidizing the semiconductive substrate. Consequently, according to the second embodiment, undesirable bird-heads and the bird-beaks are not formed, so that the scale of integration is much increased.

At the same time, since the base and emitter regions are formed through making use of the silicon nitride film as the mask, the problems of too steep steps in the isolation region, which has been caused in the etching of oxide film of the conventional technic, can fairly be avoided. (G) According to the method of the invention, especially the method of embodiment 2, a plurality of areas on the surface of the semiconductor substrate in which the diffusion is to be made are previously defined by the silicon nitride film. In other words, the substrate surface is formed with a silicon nitride film having a plurality of diffusion apertures. Subsequently, the whole area of the semiconductive substrate on which the silicon nitride film is formed is covered with a film of a material having different physical constant from that of the silicon nitride film, i.e. having different etching speed or etched by different liquid, e.g. a film having a smaller etching speed than the silicon nitride film such as silicon oxide. Consequently, it is possible to selectively perforate the silicon oxide film with a large masking tolerance, and the desired impurities are diffused without fail through the exposed diffusion apertures in the silicon nitride film. Particularly, the emitter region is selectively formed by making use of the above mentioned silicon nitride film as a mask, in the base region which has been formed through making use of the silicon nitride as a mask, in the area in the vicinity of some of the isolation regions. However, the silicon nitride film is scarecely etched when the silicon oxide film is perforated by etching for the formation of apertures for diffusing the emitter. Consequently, shortcircuiting across the junction and leakage which have been inevitable in the device manufactured by the conventional technic can be avoided. Consequently, a shallower diffusion is allowed to insure a higher speed of the semiconductor device. (H) According to the method of the invention, particularly the method of embodiment 2, the surface of the silicon in the groove formed in the substrate surface is protected by the silicon nitride film. As is well known, the silicon nitride film has a function to prevent the contamination of the inter-layer between the silicon and the semiconductor oxide film by sodium ions or the like contaminants. It is therefore possible to refill the grooves in the silicon nitride film with a viscous organic material, without taking specific measures to prevent the contamination, so that the surface of the semiconductor device can easily be flattened, and, at the same time, troubles such as breakage of the wiring and pin holes and cracking in the multi-layered wiring construction are avoided.

Figure 23:
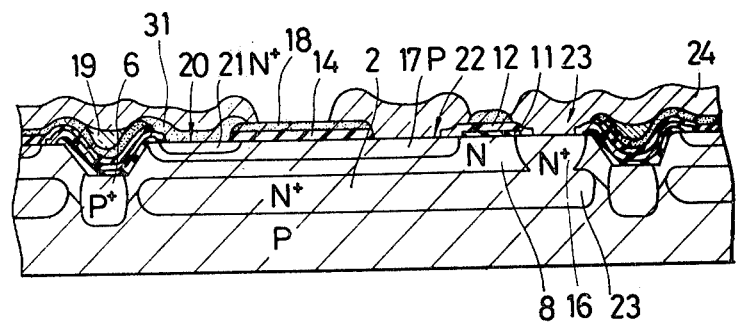
FIGS. 23, 28 and 29 are sectional views of other bipolar type IC devices produced by the method in accordance with the invention.

The advantage of the invention is remarkable especially in the production of a semiconductor device having a shallow diffusion layer with a thickness of the epitaxial layer of 1 μm or so. In such a case, polysilicon 31 is formed on the emitter as shown in FIG. 23, so as to improve the heat-resistant property of the electrode and to provide a semiconductor device having emitters of 0.1 to 0.2 μm thick and base layers of 0.3 to 0.4 μm thick. In this case, the depth of the grooves of about 0.4 to 0.5 μm is acceptable, and there is no need of refilling the grooves.

The described treating conditions of this embodiment are not exclusive, and the embodiment can be carried out by different treating conditions. For instance, the interposed layers of silicon nitride film and the semiconductor oxide film can be substituted by a single layer of oxi-nitride-silicon film. At the same time, an organic insulating material of polyamide group can be used in place of the SOG film. In addition, the kind of the impurity, method of forming the oxide film and other conditions may be changed as desired.

Figure 24:
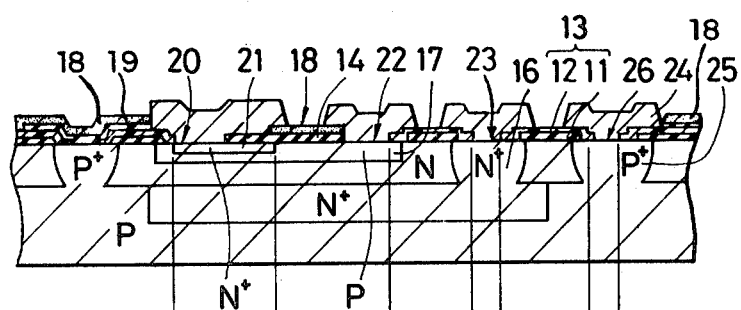
FIG. 24 is a sectional view of an embodiment of the invention, in which the invention is applied to an PN junction isolation structure.
Figure 25:
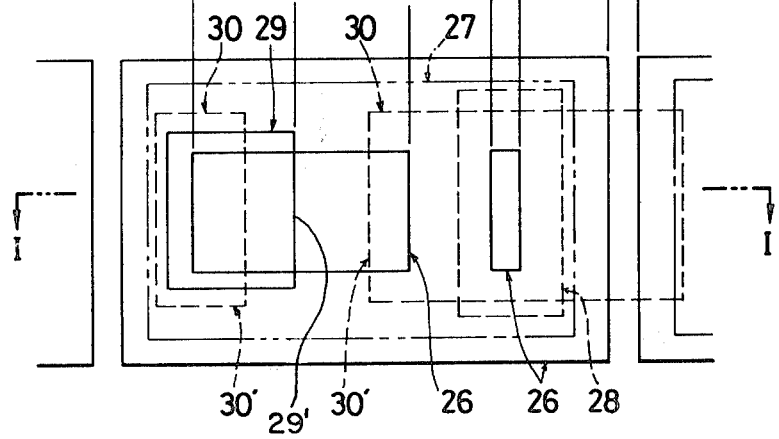
FIG. 25 shows in plan the pattern of the embodiment as shown in FIG. 24.

The technical idea of increased masking tolerance, which is afforded by the embodiment 2, can be applied to the manufacture of a PN junction isolation type semiconductor device which is used broadly in bipolar type ICs, as illustrated in FIG. 24. FIG. 25 shows in plan the pattern of the PN junction isolation structure, while FIG. 24 is a sectional view taken along the line I—I of FIG. 25.

Referring to FIG. 24, diffusion layers such as emitter layer 21, base layer 17, collector electrode leading out layer 16, and isolation diffusion layer 25 are formed respectively by diffusing impurities through apertures 20, 22, 23 and 26. And electrodes 24 are respectively contacted with the diffusion layers through the apertures 20, 22, 23 and 26. The insulating layer 13 including the silicon nitride film 12 has different physical constants from that of the SiO₂ films 14, 19 and the PSG film 18 and is scarcely etched by the admixture of fluoric acid and ammonium fluoride used for etching the SiO₂ films and the PSG film. Namely, as will be seen from FIG. 25, in designing the pattern 27 for forming the isolating P type diffusion layer 25, the pattern 28 for forming the high-concentration difusion layer 16 for leading out the collector electrode, the pattern for forming the emitter and the pattern 30 for forming the contacts, in relation with the pattern 26 for forming the insulation layer 13, the margins of the mask size have to be considered materially only at regions 29' and 30'.

Figure 26:
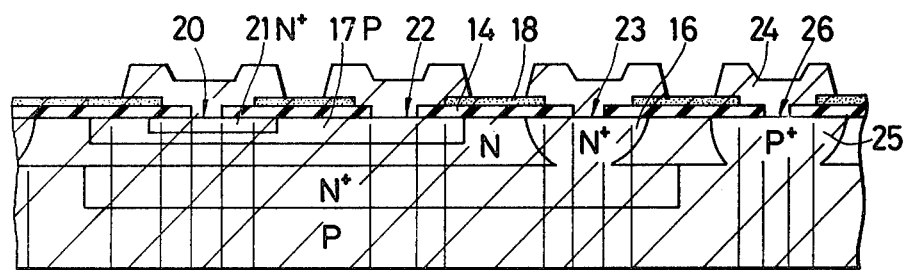
FIG. 26 is a sectional view of an IC device for explaining a drawback of a conventional PN junction isolation structure.
Figure 27:
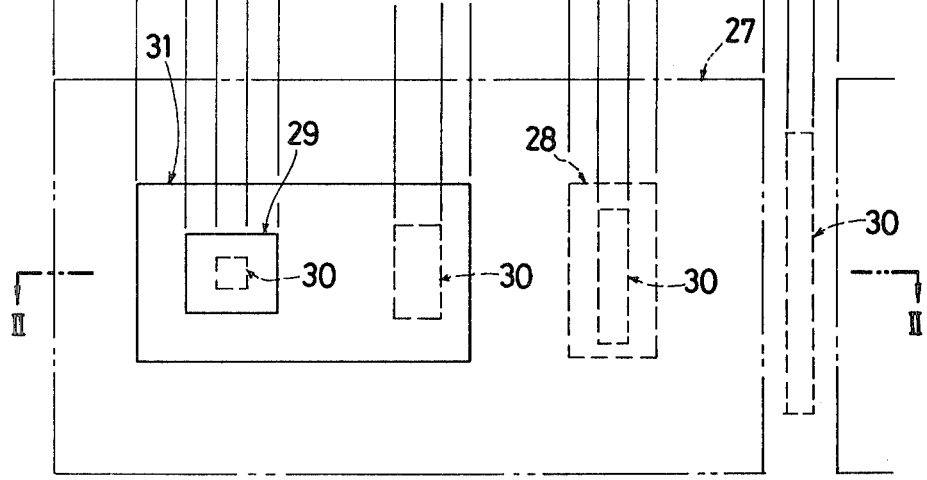
FIG. 27 shows in plan the pattern of the IC device as shown in FIG. 26.

In sharp contrast to the above, in the bipolar type PN junction isolation type semiconductor device as shown in FIG. 26, which has been manufactured by the conventional technic, the pattern 28 for forming the high-concentration diffusion layer for leading out the collector electrode, the pattern 31 for forming the base, the pattern 29 for forming the emitter and the contact patterns 30 of respective diffusion regions are successively formed by mask setting. Thus, in designing these patterns, it is necessary to consider the margins of mask sizes of almost all patterns in relation with other patterns. FIG. 26 is a sectional view taken along the line II—II of FIG. 27 which shows the patterns in plan.

Thus, according to the method of the embodiment 2 which affords a larger masking tolerance, the margins of mask sizes can be greatly reduced as compared with the conventional technic.

Figure 28:
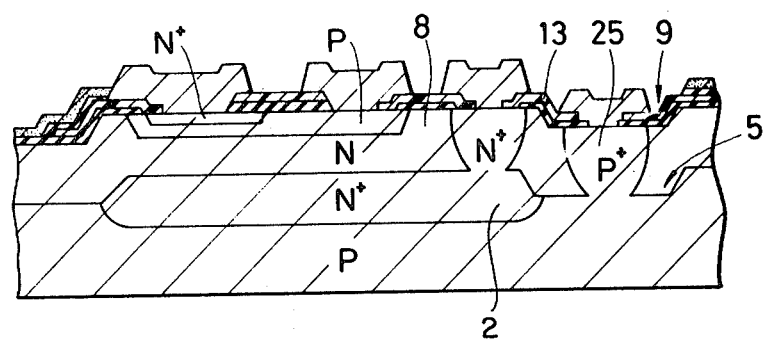
Figure 29:
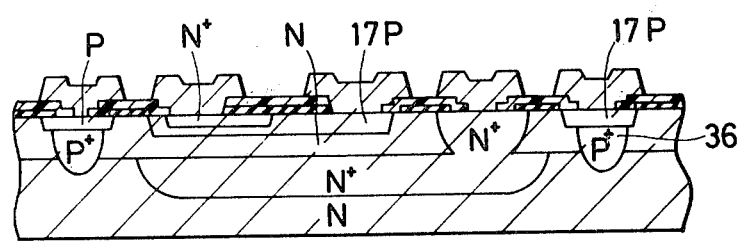

FIGS. 28 and 29 show examples of modification of the embodiments. Namely, in the construction as shown in FIG. 28, grooves 5 are formed in the surface of the substrate after the formation of the N+ type region 2. Then, an epitaxial layer 8 is made to grow, so as to form grooves 9 along the grooves 5. Subsequently, the second insulation layers 13 are formed on the grooves 8, thereby to form the isolation layer 25. The construction as shown in FIG. 29 is obtained by at first providing a P type buried region 17, and the isolation is effected simultaneously with the formation of the base region 17.

Although the invention has been described with specific reference to the bipolar LSIs, the invention can equally be applied to other types of semiconductor devices including MIS type semiconductor devices.

At the same time, it is not necessary to completely cover the second insulation layer with the silicon nitride film, if the thickness of the oxide film 11 is sufficiently small. Further, the second insulation layer may be constituted by a single layer, if oxi-nitride film, which never causes any defect in the contacting silicon surface, is used as the material for the single layer.

Also, the conditions such as kind of impurities, method of formation of the oxide film and so forth can be varied as required.

What is claimed is:

1. A method of making a semiconductor integrated circuit device including the steps of:
   (a) providing a plurality of isolated regions of one conductivity type in a semiconductor substrate, each isolated region having a substantially flat surface;
   (b) forming a first masking layer over the surface of at least one of said isolated regions, said first masking layer having first and second holes spaced apart from each other a predetermined distance in accordance with two semiconductor regions to be formed in said isolated region;
   (c) covering the surface of said isolated region within said second hole with a second masking layer;
   (d) introducing a first impurity into the isolated region through said first hole to form a first semiconductor region having a relatively high impurity concentration; and
   (e) introducing a second impurity into the isolated region through said second masking layer within said second hole to form a second semiconductor region having a relatively low impurity concentration spaced apart from said first semiconductor region.

2. A method as set forth in claim 1, wherein said step (d) includes the step of exposing the surface of said isolated region within said first hole and the step of diffusing said first impurity through the surface of said isolated region exposed within said first hole, and wherein said second impurity in said step (e) is introduced through said second masking layer within said second hole by ion-implantation.

3. A method of making a semiconductor integrated circuit device including the steps of:
   (a) providing a plurality of isolated regions of one conductivity type in a semiconductive substrate, each isolated region having a substantially flat surface;
   (b) forming a silicon nitride masking layer over the surface of at least one of said isolated regions, said silicon nitride masking layer having first and second holes spaced apart from each other a predetermined distance in accordance with two semiconductor regions to be formed in said isolated region;
   (c) introducing a first impurity into the isolated region through said first hole to form a first semiconductor region;
   (d) introducing a second impurity into the isolated region through said second hole to form a second semiconductor region spaced apart from said first semiconductor region;
   (e) forming a glass layer covering said first and second holes of the silicon nitride masking layer;
   (f) forming a third hole, in said glass layer, so as to expose a part of said second semiconductor region;
   (g) introducing a third impurity into said second semiconductor region through said third hole to form a third semiconductor region in said second semiconductor region;
   (h) removing a portion of said glass layer so that said glass layer forms a fourth hole which is spaced apart from said third hole and which exposes part of the surface of said second semiconductor region in which said third semiconductor region is not formed; and
   (i) forming first, second and third electrodes in said first, third and fourth holes in contact with said first, third and second semiconductor regions, respectively.

4. A method as set forth in claim 3, wherein said first, second and third semiconductor regions serve as collector, base and emitter regions, respectively.

5. A method of making a semiconductor integrated circuit device including the steps of:
(a) providing an isolated semiconductor region of a first conductivity type in a semiconductor body, said isolated semiconductor region serving as a collector region;
(b) forming a silicon oxide layer on said isolated semiconductor region;
(c) forming a silicon nitride layer on said silicon oxide layer;
(d) selectively removing said silicon nitride layer so as to form in said silicon nitride layer first and second holes, said holes being spaced apart from each other;
(e) introducing a first impurity of said first conductivity type into a first area of said isolated semiconductor region through said first hole so as to form a first semiconductor region serving as a collector contact region;
(f) introducing a second impurity of a second conductivity type into a second area of said isolated semiconductor region through said second hole so as to form a second semiconductor region serving as a base region;
(g) forming an insulating layer covering said second area of said isolated semiconductor region;
(h) selectively removing a portion of said insulating layer so as to form a third hole defined by end portions of said insulating layer and said silicon nitride layer, said third hole exposing a part of said second area of the said isolated semiconductor region; and
(i) introducing a third impurity of said first conductivity type into said second semiconductor region through said third hole so as to form a third semiconductor region serving as an emitter region.

6. A method as set forth in claim 5, further including the step of selectively removing another portion of said insulating layer, not removed in step h), to form a fourth hole defined by another end portion of said insulating layer and said silicon nitride layer, said fourth hole exposing part of said second area of said isolated semiconductor region in which said third semiconductor region is not formed; and then the steps of forming first, second and third electrodes in said first, third and fourth holes, respectively, said first, second and third electrodes being in contact with the said first, third and second semiconductor regions, respectively.

7. A method as set forth in claim 5, wherein said step (g) is effected before said step (f).

8. A method as set forth in claim 5, wherein said step (a) includes the steps of:
(a) preparing a semiconductor substrate of said second conductivity type opposite to said first conductivity type for using as the starting material of said semiconductor body;
(b) forming a semiconductor layer of said first conductivity type on said semiconductor substrate;
(c) forming a silicon oxide layer on said semiconductor layer and a silicon nitride layer on said silicon oxide layer to form a double layer of a silicon nitride layer and a silicon oxide layer on said semiconductor layer;
(d) selectively removing a part of said double layer, corresponding to the end portions of said isolated semiconductor region to be formed, thereby exposing portions of said semiconductor layer;
(e) etching away the exposed portions of said semiconductor layer to form grooves dividing said semiconductor layer into a plurality of sections, one section defining said isolated semiconductor region; and
(f) providing said groove with isolating means for isolating said isolated semiconductor region from said semiconductor substrate, thereby providing an isolated semiconductor region of said first conductivity type in said semiconductor body.

9. A method as set forth in any one of claims 5 or 8, wherein said second impurity is introduced through said second hole by ion implantation.

10. A method as set forth in claim 9, wherein said first and third impurities are introduced by diffusing the first and third impurities into the isolated region.

11. A method as set forth in claim 8, wherein said grooves are formed to have a depth of 0.6 to 1.0 $\mu$m.

12. The method as set forth in claim 8, wherein said semiconductor layer is formed by diffusing an impurity into said substrate to form a diffused impurity deposition layer.

* * * * *